US006981322B2

(12) United States Patent
Parish, IV et al.

(10) Patent No.: US 6,981,322 B2
(45) Date of Patent: Jan. 3, 2006

(54) COOLING APPARATUS HAVING LOW PROFILE EXTRUSION AND METHOD OF MANUFACTURE THEREFOR

(75) Inventors: Overton L. Parish, IV, Lubbock, TX (US); Roger S. DeVilbiss, Dallas, TX (US)

(73) Assignee: Thermotek, Inc., Carrollton, TX (US)

( * ) Notice: Subject to any disclaimer, the term of this patent is extended or adjusted under 35 U.S.C. 154(b) by 0 days.

(21) Appl. No.: 10/335,373

(22) Filed: Dec. 31, 2002

(65) Prior Publication Data

US 2003/0127215 A1 Jul. 10, 2003

Related U.S. Application Data

(63) Continuation-in-part of application No. 09/328,183, filed on Jun. 8, 1999, now Pat. No. 6,935,409.

(51) Int. Cl.
*B23P 6/00* (2006.01)
*F28F 7/00* (2006.01)

(52) U.S. Cl. .............................. 29/890.032; 165/80.4; 165/80.3

(58) Field of Classification Search ........... 29/890.032, 29/890.03; 165/80.3, 80.4, 104.33, 104.26, 165/104.21; 257/714; 361/699
See application file for complete search history.

(56) References Cited

U.S. PATENT DOCUMENTS

| | | |
|---|---|---|
| 3,528,494 A | 9/1970 | Levedahl |
| 4,072,188 A | 2/1978 | Wilson et al. ................ 165/80 |
| 4,196,504 A | 4/1980 | Eastman |
| 4,279,294 A | 7/1981 | Fitzpatrick et al. |
| 4,280,519 A | 7/1981 | Chapman |
| 4,381,032 A | 4/1983 | Cutchaw ..................... 165/80 |
| 4,470,450 A | 9/1984 | Bizzell et al. |
| 4,503,906 A | 3/1985 | Andres et al. |
| 4,550,774 A | 11/1985 | Andres et al. |
| 4,558,395 A | 12/1985 | Yamada et al. ............. 361/385 |
| 4,640,347 A | 2/1987 | Grover et al. |
| 4,675,783 A | 6/1987 | Murase et al. |
| 4,729,060 A | 3/1988 | Yamamoto et al. ......... 361/385 |
| 4,830,100 A | 5/1989 | Kato et al. .................. 165/80.4 |
| 4,854,377 A | 8/1989 | Komoto et al. ............ 165/80.4 |
| 4,880,052 A | 11/1989 | Meyer, IV et al. |
| 4,880,053 A | 11/1989 | Sheyman |
| 4,884,630 A | 12/1989 | Nelson et al. |
| 4,896,716 A | 1/1990 | Sotani et al. ................. 165/54 |
| 4,909,315 A | 3/1990 | Nelson et al. ............. 165/80.3 |
| 4,921,041 A | 5/1990 | Akachi |

(Continued)

FOREIGN PATENT DOCUMENTS

DE 1284506 12/1968

(Continued)

OTHER PUBLICATIONS

Andre Ali; Robert DeHoff; and Kevin Grubb; "Advanced Heat Pipe Thermal Solutions For Higher Power Notebook Computers"; Intel Corporation, Santa Clara, CA, 1999; Thermacore, Inc. Lancaster, PA 1999; 6 pages;.

(Continued)

*Primary Examiner*—Marc Jimenez
(74) *Attorney, Agent, or Firm*—Jenkens & Gilchrist, P.C.

(57) ABSTRACT

A cooling apparatus has a low profile extrusion with a plurality of micro tubes extended there through. In the caps interconnect the ends of the micro tubes in fluid communications and to inlet and outlet tubes. The low profile extrusion is placed into thermal connection with heat producing components. A heat transfer fluid is circulated through the micro tubes of the low profile extrusion, and a heat exchanger removes the heat from the heat transfer fluid.

5 Claims, 7 Drawing Sheets

U.S. PATENT DOCUMENTS

| | | | | |
|---|---|---|---|---|
| 4,982,274 | A | 1/1991 | Murase et al. | 357/82 |
| 5,002,122 | A | 3/1991 | Sarraf et al. | |
| 5,005,640 | A | 4/1991 | Lapinski et al. | |
| 5,029,389 | A * | 7/1991 | Tanzer | 29/890.032 |
| 5,036,384 | A | 7/1991 | Umezawa | 357/82 |
| 5,044,429 | A | 9/1991 | Sakaya et al. | |
| 5,054,296 | A | 10/1991 | Sotani et al. | 62/259.1 |
| 5,069,274 | A | 12/1991 | Haslett et al. | |
| 5,076,351 | A | 12/1991 | Munekawa et al. | |
| 5,084,966 | A | 2/1992 | Murase | 29/890.043 |
| 5,099,311 | A | 3/1992 | Bonde et al. | |
| 5,139,546 | A | 8/1992 | Novobilski | |
| 5,159,529 | A | 10/1992 | Lovgren et al. | 361/385 |
| 5,168,921 | A | 12/1992 | Meyer, IV | |
| 5,186,252 | A | 2/1993 | Nishizawa et al. | 165/181 |
| 5,199,487 | A | 4/1993 | DiFrancesco et al. | |
| 5,283,464 | A | 2/1994 | Murase | 257/714 |
| 5,283,715 | A | 2/1994 | Carlsten et al. | |
| 5,285,347 | A | 2/1994 | Fox et al. | 361/385 |
| 5,314,010 | A | 5/1994 | Sakaya et al. | |
| 5,316,077 | A | 5/1994 | Reichard | |
| 5,336,128 | A | 8/1994 | Birdsong | |
| 5,342,189 | A | 8/1994 | Inamura et al. | 425/461 |
| 5,353,639 | A | 10/1994 | Brookins et al. | 72/363 |
| 5,355,942 | A | 10/1994 | Conte | |
| 5,388,635 | A | 2/1995 | Gruber et al. | 165/80.4 |
| 5,409,055 | A | 4/1995 | Tanaka et al. | 165/104.33 |
| 5,465,782 | A | 11/1995 | Sun et al. | |
| 5,535,816 | A | 7/1996 | Ishida | |
| 5,555,622 | A | 9/1996 | Yamamoto et al. | 29/890.053 |
| 5,567,493 | A | 10/1996 | Imai et al. | 428/36.9 |
| 5,598,632 | A | 2/1997 | Camarda et al. | 29/890.032 |
| 5,615,086 | A | 3/1997 | Collins et al. | 361/704 |
| 5,636,684 | A | 6/1997 | Teytu et al. | |
| 5,642,775 | A | 7/1997 | Akachi | |
| 5,651,414 | A | 7/1997 | Suzuki et al. | |
| 5,660,229 | A | 8/1997 | Lee et al. | |
| 5,666,819 | A * | 9/1997 | Rockenfeller et al. | 62/480 |
| 5,675,473 | A | 10/1997 | McDunn et al. | |
| 5,682,748 | A | 11/1997 | DeVilbiss et al. | |
| 5,689,957 | A | 11/1997 | DeVilbiss et al. | |
| 5,690,849 | A | 11/1997 | DeVilbiss et al. | |
| 5,692,558 | A | 12/1997 | Hamilton et al. | |
| 5,697,428 | A | 12/1997 | Akachi | |
| 5,711,155 | A | 1/1998 | DeVilbiss et al. | |
| 5,727,619 | A | 3/1998 | Yao et al. | |
| 5,737,186 | A | 4/1998 | Fuesser et al. | |
| 5,890,371 | A | 4/1999 | Rajasubramanian et al. | |
| 5,901,037 | A | 5/1999 | Hamilton et al. | 361/699 |
| 5,901,040 | A | 5/1999 | Cromwell et al. | |
| 5,960,866 | A | 10/1999 | Kimura et al. | 165/104.33 |
| 5,989,285 | A | 11/1999 | DeVilbiss et al. | |
| 6,032,726 | A | 3/2000 | Wright et al. | 165/109.1 |
| 6,041,850 | A | 3/2000 | Esser et al. | |
| 6,058,712 | A | 5/2000 | Rajasubramanian et al. | |
| 6,072,697 | A | 6/2000 | Garcia-Ortiz | |
| 6,101,715 | A | 8/2000 | Fuesser et al. | |
| 6,148,906 | A | 11/2000 | Li et al. | |
| 6,293,333 | B1 | 9/2001 | Ponnappan et al. | |
| 6,302,192 | B1 | 10/2001 | Dussinger et al. | |
| 6,394,175 | B1 | 5/2002 | Chen et al. | |
| 6,397,935 | B1 | 6/2002 | Yamamoto et al. | |
| 6,462,949 | B1 | 10/2002 | Parish, IV et al. | |
| 6,523,259 | B1 | 2/2003 | Pinneo | |
| 6,679,316 | B1 | 1/2004 | Lin et al. | |
| 6,698,502 | B1 | 3/2004 | Lee | |
| 6,745,825 | B1 | 6/2004 | Nakamura et al. | |
| 6,795,310 | B2 | 9/2004 | Ghosh | |
| 6,810,946 | B2 | 11/2004 | Hoang | |
| 6,820,684 | B1 | 11/2004 | Chu et al. | |
| 6,828,675 | B2 | 12/2004 | Memory et al. | |
| 2002/0189793 | A1 | 12/2002 | Noda et al. | |

FOREIGN PATENT DOCUMENTS

| | | |
|---|---|---|
| DE | 3117758 | 1/1982 |
| DE | 8512617 | 9/1985 |
| DE | 19849919 | 5/1999 |
| GB | 334209 | 8/1930 |
| GB | 1402509 | 8/1975 |
| GB | 2128319 A | 4/1984 |
| GB | 2128320 A | 4/1984 |
| JP | 53136749 | 11/1978 |
| JP | 63115351 | 5/1988 |
| JP | 6291481 | 10/1994 |
| SU | 589531 | 1/1978 |
| SU | 1476297 | 4/1989 |
| WO | WO 91/06958 | 5/1991 |
| WO | WO 95/26125 | 9/1995 |
| WO | WO 98/020260 | 1/1998 |
| WO | WO 99/42781 | 8/1999 |
| WO | WO 00/70288 | 11/2000 |
| WO | WO 01/03484 A1 | 1/2001 |

OTHER PUBLICATIONS

Thermalex, Inc.; "*Setting A Higher Standard In Aluminum Extrusions*"; Brochure undated; 8 pages.

"*Furukawa Electric Heat Planar*"; Brochure undated from Trade Show, Aug. 1999; 4 pages.

"Gore's Polarchip Thermal Interface Materials . . . Bridge the Gap Between Hot PCBs and Cool Heat Sinks."; W.L. Gore and Associates, Inc. 2000; 1 page.

"Thermal Management Components To Fill Virtually Any Gap Configuration"; Stockwell Rubber Company; Nov. 2001.

* cited by examiner

COOLING APPARATUS HAVING LOW PROFILE EXTRUSION AND METHOD OF MANUFACTURE THEREFOR

RELATED APPLICATIONS

This application is a Continuation-In-Part of prior parent application Ser. No. 09/328,183 filed on Jun. 8, 1999, now U.S. Pat. No. 6,935,409.

BACKGROUND

The present invention generally pertains to cooling apparatus, and more particularly, but not by way of limitation, to cooling apparatus using "glow profile extrusions". As is explained in greater detail hereinbelow, such apparatus are extremely useful in printed circuit board (PCB) level cooling of electronic components, and for use as heat exchangers in applications where space is limited and/or low weight is critical. The present invention also pertains to an improved, high volume apparatus and method for manufacturing extruded hollow tubes for heat exchangers and heat pipes, including "low profile extrusions".

As used in this document, the term "low profile extrusion" refers to a heat exchange apparatus comprising an integral piece of metal having a series of micro extruded hollow tubes formed therein for containing a fluid. The low profile extrusions preferably have multi-void micro extruded tubes designed to operate under the pressures and temperatures required by modern environmentally safe refrigeration gases and to resist corrosion.

The micro extruded tubes are preferably interconnected at their ends so as to provide fluid communication between each tube. Such low profile extrusions are preferably formed from aluminum, although other conventional metals or metal alloys may also be used. The micro tubes can have a diameter from about 0.0625 inches to about 0.5 inches, but can also have significantly smaller diameters.

Such low profile extrusions can currently be manufactured with a profile, or height, as low as about 0.05 inches and with tubes of varying inner diameters. Of course, future advances may allow such low profile extrusions to be manufactured with an even smaller profile. Such low profile extrusions have been conventionally used in heat exchanger applications in the automotive industry, and are commercially available in strip form (having a generally rectangular geometry) or coil form (a continuous strip coiled for efficient transport). Preferred low profile extrusions are sold by Thermalex, Inc. of Montgomery, Ala. A brochure entitled "Thermalex, Inc.—Setting A Higher Standard in Aluminum Extrusions" (hereinafter the "Thermalex Brochure") provides additional detail regarding the Thermalex low profile extrusions and is incorporated herein by reference. U.S. Pat. No. 5,342,189, which is incorporated herein by reference, provides additional detail regarding an extrusion die for making such low profile extrusions. U.S. Pat. No. 5,353,639, which is incorporated herein by reference, provides additional detail regarding a method and apparatus for sizing a plurality of micro extruded tubes used in such low profile extrusions.

SUMMARY

In one embodiment, the present invention generally comprises a low profile extrusion, an inlet end cap, an inlet tube, an outlet end cap, an outlet tube, a heat transfer fluid, a means for circulating the heat transfer fluid, end means for removing heat from the heat transfer fluid. The low profile extrusion has a plurality of micro tubes with micro tube inlets and micro tube outlets, and an extrusion surface adapted for receiving heat from at least one heat generating component. The inlet end cap interconnects the micro tube inlets in fluid communication and connects the micro tube inlets in fluid communication with the inlet tube. The outlet end cap interconnects the micro tube outlets in fluid communication and connects the micro tube outlets in fluid communication with the outlet tube. The means for circulating the heat transfer fluid circulates the fluid through the inlet tube, inlet end cap, the plurality of micro tubes in the low profile extrusion, the outlet end cap, and the outlet tube.

BRIEF DESCRIPTION OF THE DRAWINGS

A more complete understanding of the method and apparatus of the present invention may be obtained by reference to the following Detailed Description when taken in conjunction with the accompanying Drawings wherein:

FIG. 5A is a schematic illustration of another embodiment of the present invention, shown as a liquid to liquid manifold cooling apparatus;

FIG. 5B is a schematic illustration of another embodiment of the present invention, shown as a liquid to air manifold cooling apparatus;

DETAILED DESCRIPTION

The preferred embodiments of the present invention and their advantages are best understood by referring to FIGS. 1–8 of the drawings, like numerals being used for like and corresponding parts of the various drawings. The present invention is illustrated herein by example, and various modifications may be made by a person of ordinary skill in the art.

Figure 1:
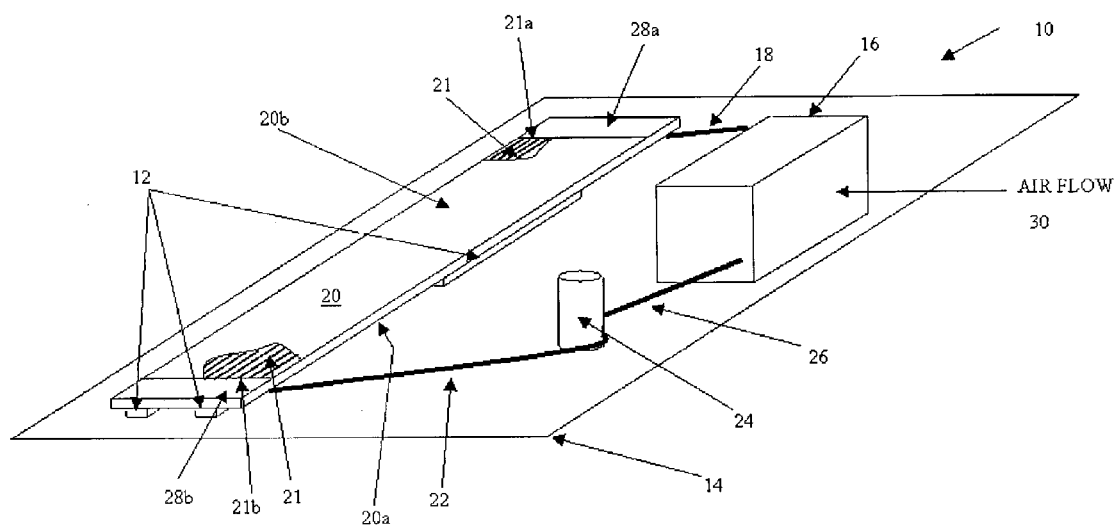
FIG. 1 is a schematic illustration of the present invention, shown as a circulation cooling apparatus for removal of heat from certain heat generating components.

FIG. 1 is a schematic illustration of a first preferred embodiment of the present invention showing a cooling apparatus 10 used for removing heat from certain heat generating components 12 mounted on a printed circuit board 14. The printed circuit board 14 may be housed in a host electronic device (not shown) such as computer, a laptop or notebook computer, or other electronic equipment. Due to the ongoing miniaturization of such host electronic devices, the heat generating components 12 are often located in an area of the printed circuit board 14 and of the host electronic device where space is extremely limited, especially in the "z", or height dimension.

The cooling apparatus 10 generally includes a conventional liquid-to-air heat exchanger 16, an inlet tube 18, a low profile extrusion 20, an outlet tube 22, a conventional pump 24, and tubing 26. The low profile extrusion 20 has a plurality of micro tubes 21, each micro tube 21 having a micro tube inlet 21a and a micro tube outlet 21b.

Micro tubes 21 are formed by a plurality of longitudinal members. The longitudinal members may be vertical or may be offset from vertical. A preferred offset from vertical is between about 5° and 60°. More preferably, longitudinal members are offset from vertical by 30°. Furthermore, longitudinal members may be provided with a capillary groove. The capillary groove may be positioned on an external surface or on the longitudinal members. Further, the capillary grooves may be provided in groups of one, two, three or more.

Figure 7:
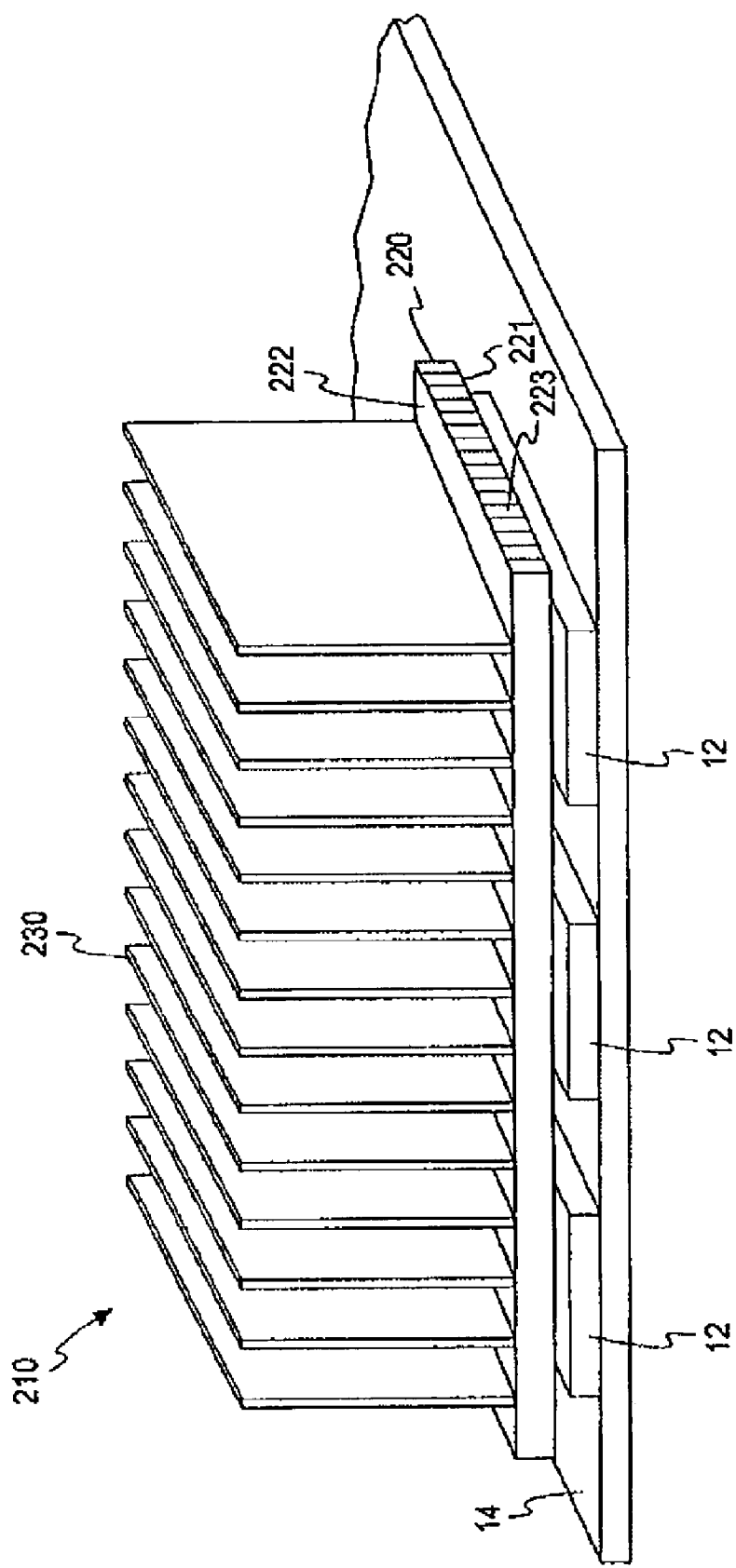
FIG. 7 is a schematic illustration of another embodiment of the present invention, shown as heat pipe base/fin cooling apparatus.
Figure 8:
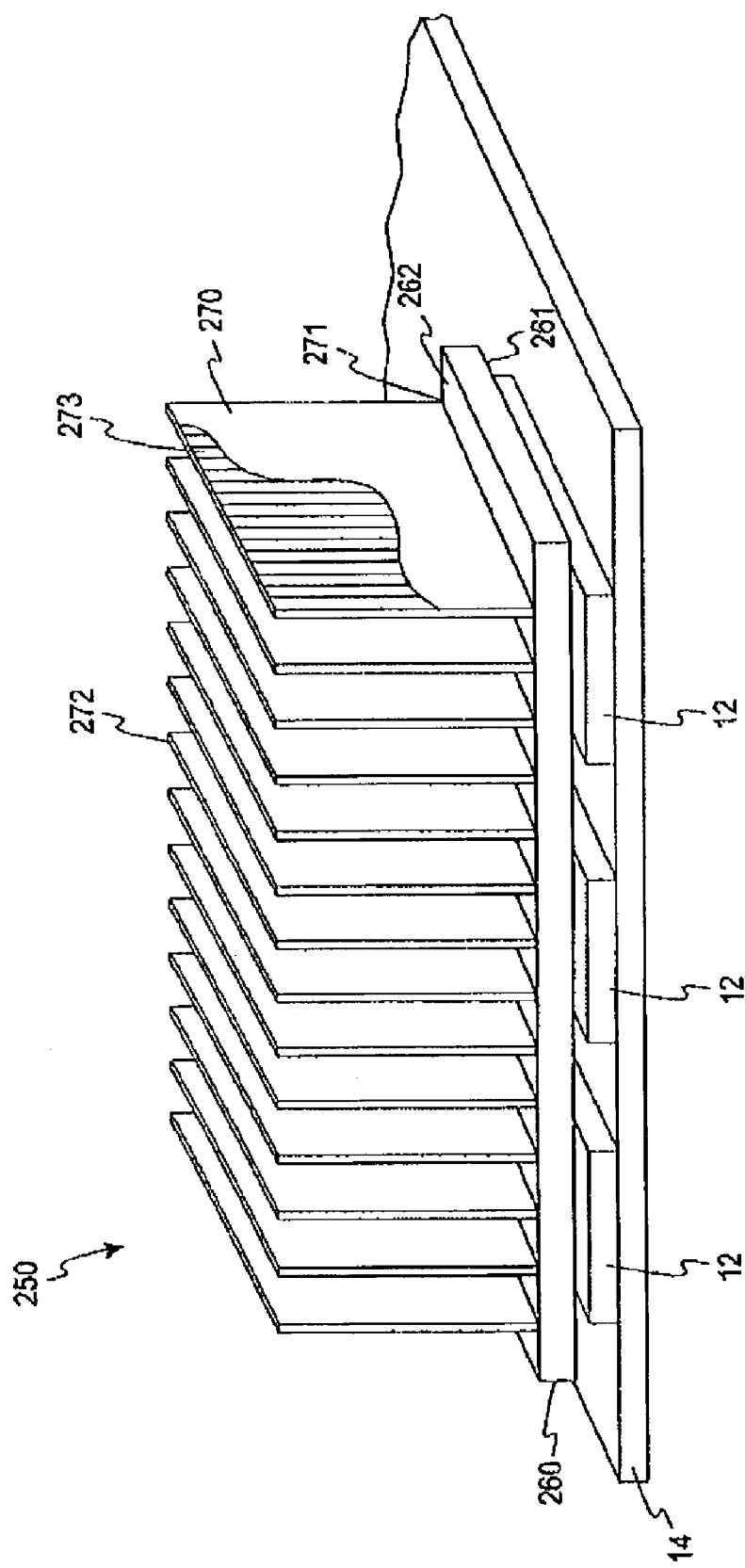
FIG. 8 is a schematic illustration of another embodiment of the present invention, shown as a base/heat pipe fin cooling apparatus.

Referring again to FIG. 1, the extrusion 20 is preferably formed with a flat surface on its underside 20a for contacting heat generating components 12, and may be formed with external fins on its top side 20b to maximize heat transfer, if space allows. It is notable that the micro tubes 21 formed in the extrusion 20 may be of nearly any geometry and that shapes with flattened heat transfer surfaces are generally preferred, but tubes of any shape could be used with varying degrees of efficiency. This is best illustrated in FIGS. 7 and 8, where flat extrusions 20 with rectangular micro tubes 21 are shown. Extrusion 20 is also preferably formed with at least one solid channel (not shown) for mounting to printed circuit board 14. Conventional thermal interface material (not shown) is preferably provided between low profile extrusion 20 and heat generating components 12.

The micro tube inlets 21a of the micro tubes 21 in the extrusion 20 are interconnected in fluid communication, and to the inlet tube 18, by an inlet end cap 28a. Similarly, the micro tube outlets 21b of the micro tubes 21 in the extrusion 20 are interconnected in fluid communication, and to the outlet tube 22, by an outlet end cap 28b. Alternatively, micro tube outlets 21a and/or 21 may be sealed by crimping the extrusion 20. Micro tubes outlets 21a and/or 21b may be individually sealed or connected in fluid communication. The heat exchanger 16 may contain a fluid reservoir (not shown) therein for housing a fluid such as water, glycol, alcohol, or other conventional refrigerants.

In addition, a wick, such as screen may be provided within one or all of micro tubes 21. In this case, fluid from the heat exchanger 16 is circulated through the inlet tube 18, the low profile extrusion 20, the outlet tube 22, and the tubing 26 via the pump 24. Alternatively, the entire cooling apparatus 10 may be evacuated and charged with fluid which is then circulated via the pump 24.

During operation of the host electronic device, heat generated by heat generating components 12 is transferred from heat generating components 12 to an evaporator section of low profile extrusion 20, to the fluid circulating within low profile extrusion 20, and then to heat exchanger 16 from a condenser section of low profile extrusion 20. Heat exchanger 16 removes the heat from the fluid in a conventional manner. Preferably, an airflow 30 is passed over heat exchanger 16 to aid in such heat removal. Cooling apparatus 10 thus efficiently removes heat from a limited space, low profile area within the host electronic device (the location of low profile extrusion 20) to an area where it can be removed at a more convenient location and envelope (the location of heat exchanger 16).

Figure 2:
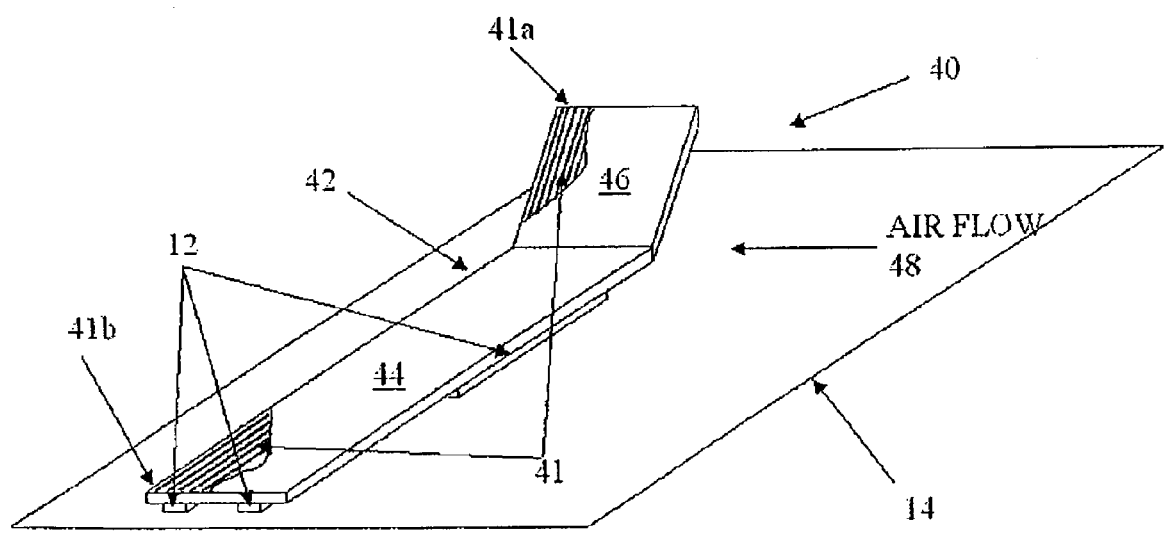
FIGS. 2 and 3 are schematic illustrations of another embodiment of the present invention, shown as the heat pipe type cooling apparatus for removal of heat from certain heat generating components.
Figure 3:
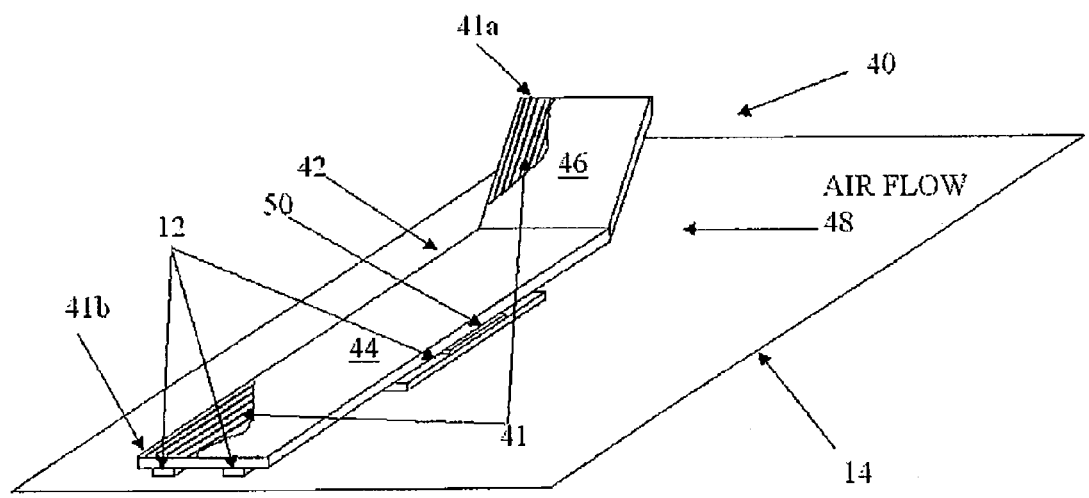

FIGS. 2 and 3 are schematic illustrations of a second preferred embodiment of the present invention showing a cooling apparatus 40 used for removing heat from heat generating components 12 on printed circuit board 14. Referring first to FIG. 2, cooling apparatus 40 generally comprises a low profile extrusion 42 manufactured as a heat pipe capable of phase change heat transfer. A preferred method of making a low profile heat pipe extrusion 42 is described in greater detail hereinbelow. The low profile heat pipe extrusion 42 is preferably formed with micro tubes 41, each micro tube 41 having a conventional wick structure such as internal fins, grooved inner sidewalls, or metal screens, so as to maximize their heat transfer capability via capillary action.

To form a heat pipe, the micro tubes 41 of the low profile heat pipe extrusion 42 are evacuated and then charged with a fluid such as water, glycol, alcohol, or other conventional refrigerants before sealing the ends 41a and 41b of the micro tubes 41. The ends may be sealed by crimping. By providing vertically offset longitudinal members, longitudinal members tend to lay over during crimping rather than buckling. Therefore, vertically offset members may be advantageous. As is known in the art, a heat pipe generally has an effective thermal conductivity of several multiples higher than that of a solid rod. This increase in efficiency is due to the fact that the phase change heat transfer coefficients are high compared to the thermal conductivity of conventional materials.

The low profile heat pipe extrusion 42 is preferably formed into an evaporator section or first portion 44 for contacting heat generating components 12 and a raised or condenser section second portion 46. First portion 44 and second portion 46 are preferably substantially similar in construction to low profile extrusion 20 of FIG. 1, except end caps 28 are not required. First portion 44 acts as the evaporator section of the heat pipe, and second portion 46 acts as the condenser section of the heat pipe.

During operation of the host electronic device, heat generated by heat generating components 12 is transferred from heat generating components 12 to first portion 44. This heat causes the liquid within the micro tubes 41 in first portion 44 to change to vapor, consuming some of the generated heat. Because the vapor is less dense than the surrounding liquid, the vapor and associated heat rise into the micro tubes 41 in second portion 46. Of course, heated liquid may also be transferred from first portion 44 to second portion 46 via the capillary action of the wick structures of the micro extruded tubes therein. In second portion 46, the vapor condenses into liquid onto the inner side walls of the micro extruded tubes 41. The heat generated by the condensation reaction, as well as any heat transferred via capillary action of the wick structure, is then transferred to air flow 48. Cooling apparatus 40 thus efficiently removes heat from a limited space, low profile area within the host electronic device (the location of first portion 44) to an area where it can be removed at a more convenient location and envelope (the location of second portion 46). Of course, if low profile heat pipe extrusion 42 is formed with internal wick structures, it is not necessary that second portion 44 be raised from, or higher than, first portion 42.

Referring now to FIG. 3, low profile heat pipe extrusion 42 is shown in operation with a conventional thermoelectric cooler (TEC) 50 in contact with one of heat generating components 12. A preferred TEC is sold by Marlow Industries, Inc. of Dallas, Tex. TEC 50 facilitates the heat transfer between the heat generating component 12 and first portion 44 of low profile heat pipe extrusion 42, and thus is preferred for use with heat generating components 12 that have high power densities.

Figure 4:
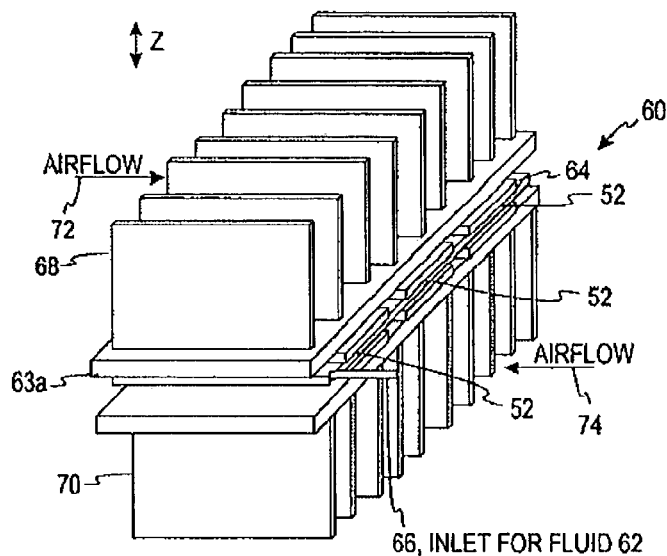
FIG. 4 is a schematic illustration of another embodiment of the present invention, shown as heat transfer component of a recirculatory system.

FIG. 4 is a schematic illustration of a third preferred embodiment of the present invention showing a cooling apparatus 60 used for removing heat from a fluid 62, such as water, glycol, alcohol, or other conventional refrigerants. Fluid 62 is then used to cool conventional heat generating components, such as heat generating components 12 of printed circuit board 14. By way of example, cooling apparatus 60 may be used in place of conventional heat exchanger 16 in FIG. 1.

Cooling apparatus 60 generally comprises a low profile extrusion 64, an inlet end cap 63a, an inlet tube 66, an outlet end cap (not shown), an outlet tube (not shown), thermoelectric coolers 52, and conventional bonded fin heat sinks 68 and 70. The low profile extrusion 64 is preferably substantially similar in construction to low profile extrusion 20 of FIG. 1, with a plurality of micro tubes (not shown) having a micro tube inlet and a micro tube outlet (not shown). The micro tube inlets of the micro tubes in the extrusion 64 are interconnected in fluid communication, and to the inlet tube 66, by the inlet end cap 63a. Similarly, the micro tube outlets of the micro tubes in the extrusion 64 are interconnected in fluid communication, and to the outlet tube, by an outlet end cap.

The low profile extrusion 64 preferably has generally flat bottom and top surfaces for contact with thermoelectric coolers (TEC) 52. The conventional bonded fin heat sink 68 is coupled to TECs 52 on the top surface of low profile extrusion 64, and the conventional bonded fin heat sink 70 is coupled to TECs 52 on the bottom surface of low profile extrusion 64.

In operation, the low profile extrusion 64 serves as a manifold, and the TECs 52 remove heat from fluid 62 flowing through the micro tubes of the low profile extrusion 64. This removed heat is transferred from TECs 52 to bonded fin heat sinks 68 and 70, which dissipate the heat to atmosphere in a conventional manner. Preferably, airflows 72 and 74 pass over and through heat sinks 68 and 70 to facilitate such heat dissipation.

Low profile extrusion 64 has a smaller size and mass than conventional heat exchanger manifolds. For example, a conventional manifold has a minimum profile, or height, in the "z" direction of about 0.75 inches, and low profile extrusion 64 may have a profile as low as about 0.1 inches. The reduced mass of low profile extrusion 64 is believed to produce a cooling apparatus 60 with a near zero time constant, increasing startup performance and temperature control. Therefore, cooling apparatus 60 is especially advantageous in applications involving lasers. The wavelength of a laser beam, and thus beam properties, is strongly influenced by temperature, and the tighter temperature control believed to be provided by cooling apparatus 60 is extremely beneficial.

Figure 5C:
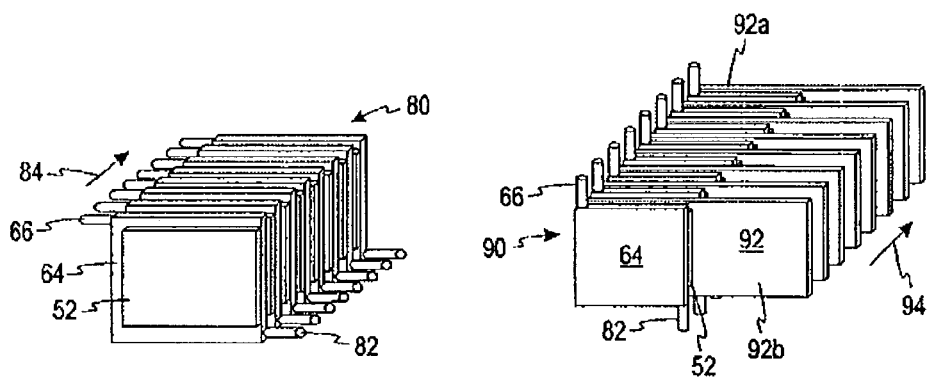
FIG. 5C is a schematic illustration of another embodiment of the present invention, shown as an air to air manifold cooling apparatus.
Figure 5C:
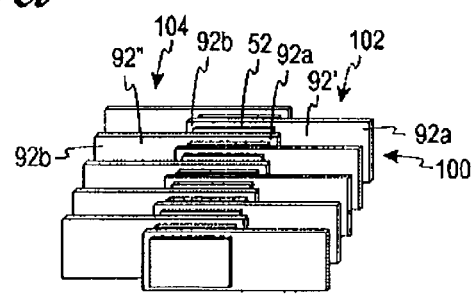

FIGS. 5A, 5B, and 5C are schematic illustrations of fourth, fifth, and sixth preferred embodiments of present invention. FIG. 5A shows a cooling apparatus 80 having a plurality of low profile extrusions 64 and TECs 52 arranged in a serial fashion. A TEC 52 is disposed between, and is in contact with, each of the extrusions 64. Only one low profile extrusion 64 and one TEC 52 is numbered in FIG. 5A for clarity of illustration. Fluid 62 enters each extrusion 64 via inlet 66 and exits each extrusion 64 via an outlet 82. In operation, TECs 52 remove heat from fluid 62 flowing through low profile extrusions 64. This removed heat is transferred to airflow 84 passing over cooling apparatus 80.

FIG. 5B shows a cooling apparatus 90 having a plurality of low profile extrusions 64, TECs 52, and low profile heat pipe extrusions 92 arranged in a serial fashion. More specifically, a TEC 52 is disposed between, and is in contact with, each low profile extrusion 64 and low profile heat pipe extrusion 92. Only one low profile extrusion 64, one TEC 52, and one low profile heat pipe extrusion 92 are numbered in FIG. 5B for clarity of illustration. Each low profile heat pipe extrusion 92 is preferably substantially similar in construction to low profile heat pipe extrusion 42 o FIG. 1, excluding raised portion 46. Fluid 62 enters each extrusion 64 via inlet 66 and exits each extrusion 64 via outlet 82. In operation, each TEC 52 removes heat from fluid 62 flowing through an adjacent low profile extrusion 64. This removed heat is transferred to the evaporator portion 92a of the adjacent low profile heat pipe extrusion 92. The heat is then transferred to the condenser portion 92b of the low profile heat pipe extrusion 92, as is explained hereinabove in connection with low profile heat pipe extrusion 42 of FIGS. 2 and 3. An airflow 84 passing over cooling apparatus 90 dissipates heat from each condenser portion 92b of each low profile heat pipe extrusion 92.

FIG. 5C shows a cooling apparatus 100 having a plurality of TECs 52 and low profile heat pipe extrusions 92 arranged in a serial fashion. More specifically, a TEC 52 is disposed between, and is in contact with, each low profile heat pipe extrusion 92, and the "free end" of adjacent low profile heat pipe extrusions 92 extend in opposite directions. Only one TEC 52 and two low profile heat pipe extrusions, 92' and 92", are numbered in FIG. 5C for clarity of illustration. In operation, a hot airflow 102 flows over each evaporator portion 92a of low profile heat pipe extrusions 92'. This heat is transferred from evaporator portion 92a to condenser portion 92b of extrusion 92', as is explained hereinabove in connection with low profile heat pipe extrusion 42 of FIGS. 2 and 3. Condenser portion 92b of extrusion 92' is in contact with TEC 52. The TEC 52 removes heat from condenser portion 92b of extrusion 92' and transfers it to evaporator portion 92a of low profile heat pipe extrusion 92". This heat is then transferred from evaporator portion 92a to condenser portion 92b of extrusion 92". Cold airflow 104 passing over condenser portions 92b of each extrusion 92" dissipates heat from cooling apparatus 100.

Cooling apparatus 80, 90, and 100 have the same applications and advantages of cooling apparatus 60 described hereinabove. As will be appreciated by one skilled in the art, cooling apparatus 60, 80, and 90 may also be operated as heating apparatus by using thermoelectric coolers (TECs) 52 to heat, rather than to cool, a fluid.

Figure 6:
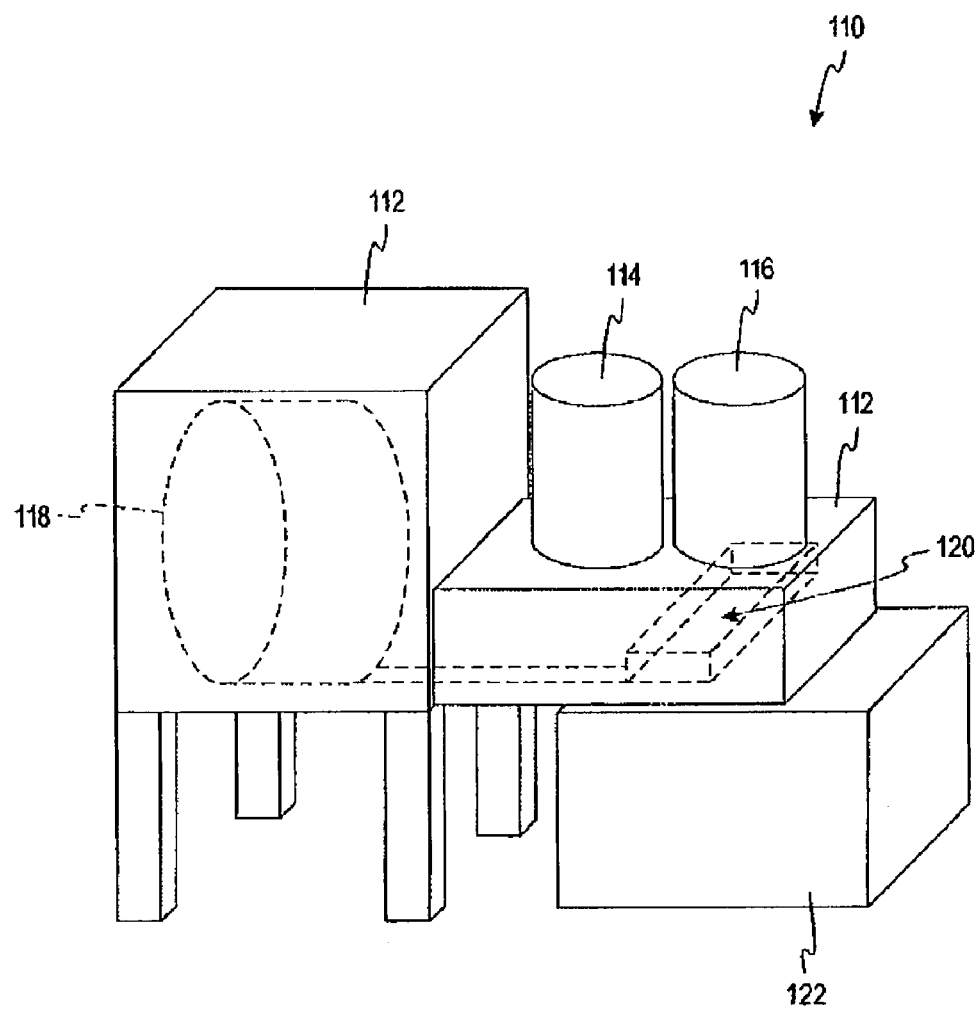
FIG. 6 is a is a schematic illustration of a method and apparatus for manufacturing heat pipes according to an embodiment of the present invention.

FIG. 6 is a schematic illustration of a method and apparatus for manufacturing heat pipes according to a seventh preferred embodiment of the present invention. As noted hereinabove, the preferred apparatus and method may be utilized to make low profile heat pipe extrusions 42 and 92 of FIGS. 2, 3, 5B, and 5C. However, the preferred apparatus and method may also be utilized to make extruded hollow tubes for other heat exchangers and heat pipes.

Apparatus 110 generally includes an oven 112 having an insulated housing. A vacuum station 114 and a fluid charging station 116 are in fluid communication with oven 112. Alternatively, stations 114 and 116 may be separate from oven 112. A coil 118 is disposed within a portion of oven 112 on a conventional automatic feed system. Coil 118 may be a coil of hollow tubing, a coil of low profile extrusion, or a coil of other conventional extrusion having a series of extruded hollow tubes therein. Furthermore, coil 118 comprises any material that can be formed and welded with any fluid fill. This includes, but is not limited to aluminum, stainless steel, carbon steel, copper, and titanium alloys. An ultrasonic welder/sealer is also provided. One model of ultrasonic welder/sealer is the Ultraseal® series sold by American Technology, Inc. of Shelton, Conn. A brochure entitled "Ultraseal®-20 20 kHz. Portable Ultrasonic Metal Tube Sealer" (hereinafter the "Amtech Brochure") provides additional information regarding the Ultraseal® series of ultrasonic welder/sealers and is incorporated herein by reference. A preferred ultrasonic welder/sealer is the Stapla Ultrasonic gantry style seam welder.

In a conventional process, the first step is actually forming and cutting the heat exchanger, heat pipe, or extruded tubes into the desired configuration. Next, this preformed system is evacuated and charged with a fluid such as water, glycol, alcohol, or other conventional refrigerants. The system is then sealed, completing the process. Conventional processes are expensive because they are labor intensive and require long setup times for different configurations of heat exchangers, heat pipes, or extruded tubes.

However, apparatus 110 may be used to efficiently and economically produce heat exchangers, heat pipes, and extruded tubes, including low profile extrusions, according to the following preferred process. First, coil 118 is placed within a heat producing device such as oven 112 on the automatic feed system. Second, coil 118 is evacuated using vacuum station 114. Preferably, coil 118 is pulled down to a vacuum of about $10^{-7}$ torr for a period lasting approximately twenty four hours to many weeks depending on performance requirements. Third, coil 118 is charged with a known amount of fluid, such as water, glycol, alcohol, acetone or other conventional refrigerants, using charging station 116. Acetone is the preferred fluid. Alternatively, coil 118 may be evacuated and charged outside oven 112. Fourth, oven 112 heats coil 118 until at least some of the fluid is in the vapor phase, and the vapor fills the interior of coil 118 evenly. Fifth, using the automatic feed system, the heated and charged coil 118 is reeled out. Preferably the fluid exits the oven 112 at approximately 40° C. to 60° C. allowing enough thermal inertia to draw vapor into the extrusion external to the oven. A temperature sender container may be provided to ensure that the fluid exit temperature is maintained at a desired level. The coil is then processed by crimping, sealing, and cutting the coil 118 into desired lengths. The temperature difference between the oven 118 and the ambient air (or air-conditioned air) temperature condenses the charging fluid in each pipe before it is crimped. These temperatures and flows are used to control the individual heat pipe fills via a weight analysis. A computer and scale monitor the weight of each part and adjust the oven temperatures accordingly.

Subsequent steps comprise crimping, sealing and cutting the coil 118. A hydraulic press, pneumatic or mechanical means may be used for crimping. An ultrasonic welder/sealer, or another standard welding method such as laser electron beam, resistive, TIG, or MIG welding may be used during the sealing stage. Ultrasonic welding is the preferred process. A plasma cutter, or other standard welding method mentioned herein may be used in the cutting stage. However, the plasma cutter is the preferred method. Finished product is collected within container 122. In this manner, heat exchangers, heat pipes, and extruded tubes, including low profile extrusions, are formed while charged with fluid, significantly reducing the setup time and vacuum expense over conventional processes.

In addition, by separating the coil side of the process from the crimping, sealing and welding process steps, the temperatures for the process steps can be adjusted so as to be in the fluid range for the working fluid. Thus, if a cryogenic heat pipe (charging fluid is typically a gas at normal room temperature) is to be manufactured, the temperature of the process steps would be adjusted such that the charging fluid is a liquid. In a similar manner, high temperature heat pipes, where the charging fluid is typically a solid at room temperatures, can be manufactured.

FIG. 7 illustrates another embodiment of the present invention, showing a cooling apparatus 210 used for removing heat from heat generating components 12 on printed circuit board 14. The cooling apparatus 210 comprises a low profile extrusion 220 manufactured as a heat pipe capable of phase change heat transfer. The low profile heat pipe extrusion 220 is formed having a plurality of micro tubes 230, preferably having therein conventional wick structure inside such as internal fins, grooved inner side walls, or metal screens, so as to maximize there heat transfer capability via capillary action. The micro tubes 223 of the low profile heat pipe extrusion 220 are evacuated and then charged with a fluid such as water, glycol, alcohol, or other conventional refrigerants, before the ends of the micro tubes are sealed.

The low profile heat pipe extrusion 220 has a first surface 221 for engaging the heat generating components 12 and receiving heat transfer therefrom. On a second surface 222 of the low profile extrusion 220, a conventional bonded fin heat sink 230 or plurality of cooling fins are mounted to the low profile extrusion 220. Preferably, the micro tubes 223 are disposed in a direction perpendicular to the fins 230 for transfer of heat between each of the individual fins 230. The heat transfer between the individual fins 230 promotes the even distribution of heat across each of the individual fins 230. However, the micro tubes 223 can be oriented for the transfer of heat along the length of the fins 230. Additionally, in one preferred embodiment, the micro extruded hollow tubes 223 in the low profile extrusion 220 are oriented for disbursing heat from the heat generating components 12 to areas of the low profile extrusion 220 which are not in contact with a heat generating components 12.

The use of the low profile extrusion 220 for transferring heat in the cooling apparatus 200 increases the effective surface area that heat is transferred from the heat generating components to the cooling fins 230. The resulting cooling apparatus is therefore smaller in size and lighter in weight for the same effective cooling attributes. In some embodiments, the present invention can decrease the weight of an apparatus for cooling a heat generating component by as much as 50% over traditional fins mounted via a metal plate.

FIG. 8 illustrates another embodiment of the present invention, showing a cooling apparatus 250 used for removing heat from heat generating components 12 on printed circuit board 14. The cooling apparatus generally comprises a base 260 and a plurality of low profile extrusion fins 270. The base 260 has a first side 261 for heat transfer between the cooling apparatus 250 and heat generating components 12. The base 260 also has a second surface 262 for mounting the low profile extrusion fins 270.

The low profile extrusion fins 270 are low profile extrusions manufactured as a heat pipe capable of phase change heat transfer. The low profile extrusion heat piping 270 are preferably formed with a plurality of micro tubes 273 each preferably having a conventional wick structure such as internal fins, grooved inner side walls, or metal screens, so as to maximize the heat transfer capability via capillary action. The micro tubes 273 of the low profile extrusion heat piping 270 are evacuated and then charged with a fluid such as water, glycol, alcohol, or other conventional refrigerants, before the micro tubes 273 are sealed.

A first end 271 of the low profile extrusion fins 270 is mounted to the second surface 262 of the base 260 with a second end 272 extending outwardly therefrom. The plurality of low profile extrusion fins 270 are preferably mounted in rows for convection heat transfer to the surrounding environment. In one embodiment, the base 260 can also be formed from a low profile extrusion similar to the low profile extrusion 220 in FIG. 7.

The use of the heat pipe type low profile extrusion fins 270 in the cooling apparatus 250 increases the effective surface area in which heat is transferred from the heat generating components to the surrounding environment via the base 260. The resulting cooling apparatus is therefore smaller in size and lighter in weight for the same effective cooling attributes.

In operation, the present invention is useful in applications, such as notebook computers, computer network servers, desktop computers, power supplies, chillers/heaters, and telecommunication applications.

The present invention is particularly well suited for applications requiring a heat removal apparatus that has minimal spacial area, such as notebook computer applications. A heat pipe according to the principles of the present invention may be extruded with various twists and turns to maximize heat removal ability in a minimal amount of space.

For applications involving high performance microprocessors, a heat pipe with fins attached opposite one another on the top and bottom surfaces of heat pipe may be used. This configuration allows improved heat removal characteristics.

It is believed that the operation and construction of the present invention will be apparent from the foregoing description of a preferred embodiment. While the device shown is described as being preferred, it will be obvious to a person of ordinary skill in the art that various changes and modifications may be made therein without departing from the spirit and scope of the invention as defined in the following claims. Therefore, the spirit and the scope of the appended claims should not be limited to the description of the preferred embodiments contained herein.

We claim:

1. A method of manufacturing fluid filled low profile extrusions, comprising the steps of:
    placing a coil within an oven;
    evacuating said coil;
    filling said coil with a heat transfer fluid;
    heating said coil until all of said fluid is in a vapor phase;
    crimping said coil;
    sealing said coil; and
    cutting said coil into lengths.

2. The method according to claim 1, wherein the step of charging said coil with a fluid comprises the step of charging said coil with water.

3. The method according to claim 1, wherein the step of charging said coil with a fluid comprises the step of charging said coil with glycol.

4. The method according to claim 1, wherein the step of charging said coil with a fluid comprises the step of charging said coil with alcohol.

5. The method according to claim 1, wherein the step of charging said coil with a fluid comprises the step of charging said coil with a conventional refrigerant.

* * * * *

UNITED STATES PATENT AND TRADEMARK OFFICE
CERTIFICATE OF CORRECTION

PATENT NO. : 6,981,322 B2  Page 1 of 1
DATED : January 3, 2006
INVENTOR(S) : Overton L. Parish It is certified that error appears in the above-identified patent and that said Letters Patent is hereby corrected as shown below:

Column 1,
Line 15, replace "glow" with -- low --.

Signed and Sealed this

Fourteenth Day of March, 2006

JON W. DUDAS
*Director of the United States Patent and Trademark Office*